United States Patent [19]

Miyaji

[11] Patent Number: 5,047,985
[45] Date of Patent: Sep. 10, 1991

[54] STATIC RANDOM ACCESS MEMORY DEVICE HAVING A HIGH SPEED READ-OUT AND PRECHARGING ARRANGEMENT

[75] Inventor: Fumio Miyaji, Kanagawa, Japan

[73] Assignee: Sony Corporation, Tokyo, Japan

[21] Appl. No.: 636,578

[22] Filed: Jan. 2, 1991

Related U.S. Application Data

[62] Division of Ser. No. 312,865, Feb. 17, 1989.

[30] Foreign Application Priority Data

Feb. 19, 1988 [JP] Japan ................................. 63-36711
Feb. 19, 1988 [JP] Japan ................................. 63-36712
Feb. 20, 1988 [JP] Japan ................................. 63-37908

[51] Int. Cl.$^5$ .......................................... G11C 13/00
[52] U.S. Cl. .................................. 365/203; 365/154
[58] Field of Search ........... 365/190, 203, 154, 189.01, 365/205

[56] References Cited

U.S. PATENT DOCUMENTS

5,010,523 4/1991 Yamauchi ........................... 365/203

Primary Examiner—Terrell W. Fears
Attorney, Agent, or Firm—Philip M. Shaw, Jr.

[57] ABSTRACT

The invention provides an improved semiconductor memory device such as a static RAM. The semiconductor memory device attains high speed read-out of data therefrom without increasing a step of production process. The semiconductor memory device further attains a flash-clearing function without increasing the size of a chip thereof.

4 Claims, 11 Drawing Sheets

FIG.17

STATIC RANDOM ACCESS MEMORY DEVICE HAVING A HIGH SPEED READ-OUT AND PRECHARGING ARRANGEMENT

BACKGROUND OF THE INVENTION

1. Field of the Invention

This invention relates to a semiconductor memory device such as a static RAM (random access memory) device, and more particularly to a high speed read-out function and a flash-clear function of a semiconductor memory device.

2. Description of the Prior Art

A semiconductor memory device such as a static RAM which has a high speed read-out function is already known and disclosed, for example, in Japanese Patent Publication No. 60 (1985)-44747, wherein high speed operation is attained by suitably controlling variable load means provided at terminal ends of bit lines (data lines).

A semiconductor device of the precharging type is also known wherein, upon selection of a word line, bit lines are brought into a floating state to reduce current flow into memory cells of the device and a quick change in potential is attained by driving transistors for the memory cells.

Figure 1:
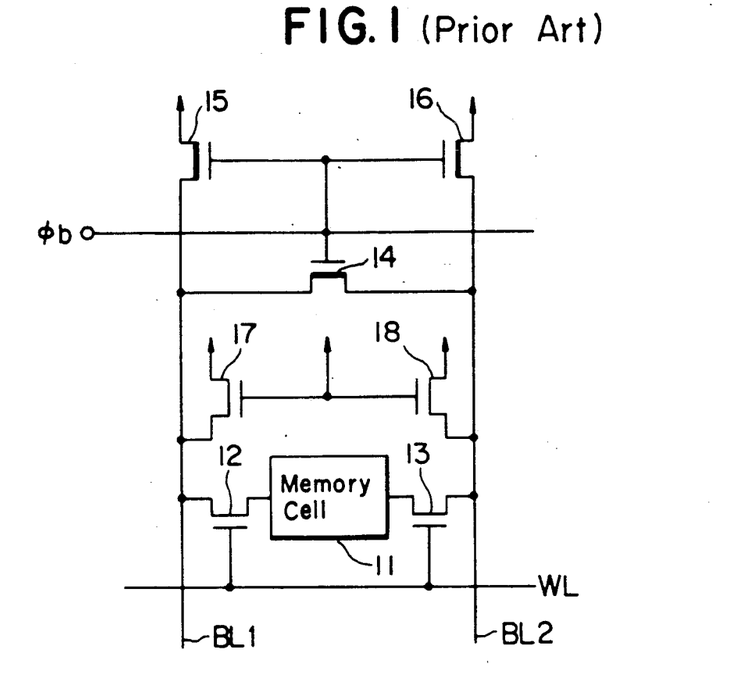
FIG. 1 is a circuit diagram of part of an exemplary one of conventional memory devices.

FIG. 1 shows a partial circuit configuration of an exemplary one of conventional memory devices (SRAMs) which employs such a precharging technique. In the memory device shown, a memory cell 11 is disposed between a pair of bit lines BL1 and BL2 via access transistors 12 and 13 the gates of which are connected to a word line WL. A pair of NMOS transistors 15 and 16 serving as load elements are provided at the terminal ends of the bit lines BL1 and BL2. A power source voltage Vcc is applied to the drains of the NMOS transistors 15 and 16. Another equalizing NMOS transistor 14 is disposed between the bit lines BL1 and BL2. Each of the NMOS transistors 14, 15 and 16 has a threshold voltage Vth(L) which is lower than that of ordinary NMOS transistors, and a precharge signal Φb is supplied in common to the gates of the NMOS transistors 14, 15 and 16.

A further pair of NMOS transistors 17 and 18 are connected at the sources thereof to the bit lines BL1 and BL2, respectively. The gates and drains of the NMOS transistors 17 and 18 are connected in common to the power source voltage Vcc. The NMOS transistors 17 and 18 have an ordinary threshold voltage Vth.

Figure 2:
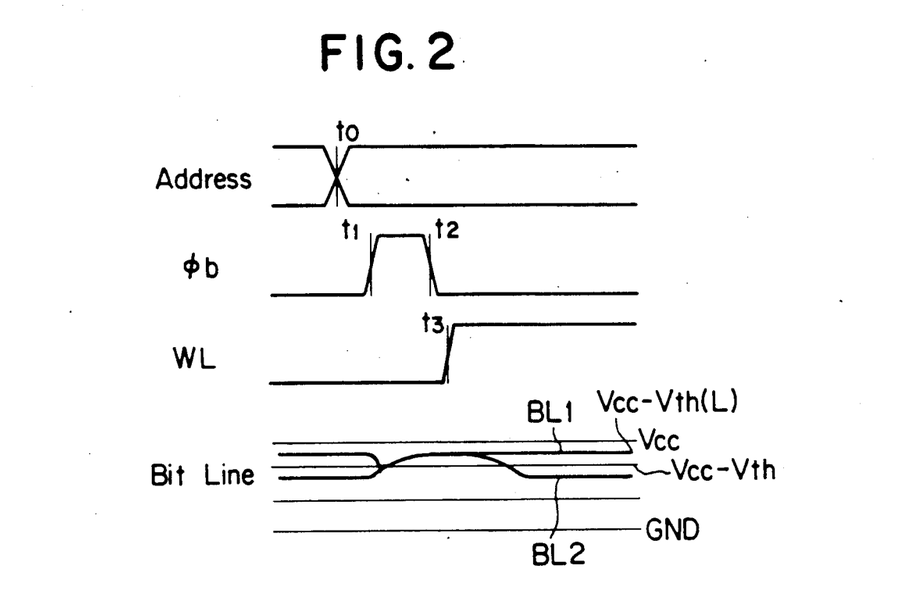
FIG. 2 is a signal waveform chart illustrating operation of the memory device shown in FIG. 1.

The memory device having such a circuit configuration operates in the following manner. Referring to FIG. 2, an address signal tot he memory device transits at an instant t0, and a precharge signal Φb rises at an instant t1 before a signal on the word line WL rises at an instant t3. As a result of such a rise of the precharge signal Φb, the bit lines BL1 and BL2 are equalized via the NMOS transistor 14 and then the NMOS transistors 15 and 16 are turned on. Consequently, the potentials on the bit lines BL1 and BL2 are raised up to a level equal to Vcc−Vth(L). Thereupon, the potential difference between the gates and sources of the NMOS transistors 17 and 18 is decreased lower than the threshold voltage Vth to thereby turn off the NMOS transistors 17 and 18. Then at an instant t2, the precharge signal Φb falls. Consequently, the NMOS transistors 14, 15 and 16 are all turned off to thereby place the bit lines BL1 and BL2 into a floating state. Then at the instant t3, the word line WL rises, and consequently the potential on one of the bit lines BL1 and BL2 is lowered by a driving transistor not shown in the memory cell 11. When the potential on the one bit line BL1 or BL2 is lowered below the level of Vcc−Vth, that one of the NMOS transistors 17 and 18 which is connected to the one bit line BL1 or BL2 is turned on so that the lower potential on the one bit line BL1 or BL2 is thereafter maintained at a constant level.

With the memory device described above, the NMOS transistors 15 and 16 have a threshold voltage Vth(L) which is lower than an ordinary threshold voltage Vth. Consequently, a high bit line potential can be attained upon precharging, and a sufficiently great difference signal can be produced between the two bit lines.

In a conventional memory device, however, NMOS transistors having a lower threshold voltage Vth(L) are used as load elements formed at the terminal ends of the bit lines BL1 and BL2. Accordingly, a step for lowering the threshold voltage is necessary in addition to the ordinary process, which eventually brings about an increase in production cost.

Furthermore, a random access memory device such as a static RAM device is equipped with a flash clear function. According to the function, when a single control signal is fed from an external circuit, either "0" or "1" is written into all of memory cells of the memory device at a time. Therefore, such a function is utilized for initializing the memory device for resetting or testing.

In a conventional random access memory device, the flash clear is executed simultaneously for an entire memory cell array of the memory device. This raises a problem that the current flow upon flash clearing presents a critically high peak value.

In fact, the storage capacity of a memory device has been increased significantly in recent years and a memory cell array is in a fair way to a large scale. If such a large scale memory cell array is cleared at one time, the peak electric current flow in the memory device amounts to an extremely high value. An increase of such a peak current will naturally cause considerable variation in the level of the power supply line or the ground line serving the memory device. Accordingly, there is the possibility that noises may be produced or wires in the chip may be fused to cause destruction of the inner structure of the chip or destruction of an appliance in which the memory device is used.

In view of such circumstances, several inventions have been made wherein a memory cell array is segmented into a plurality of memory cell groups to which a batch writing operation is made successively at different timings. One of such inventions is disclosed in Japanese Patent Application No. 62 (1987)-290408 filed by the applicant of the present patent application.

Figure 3A:
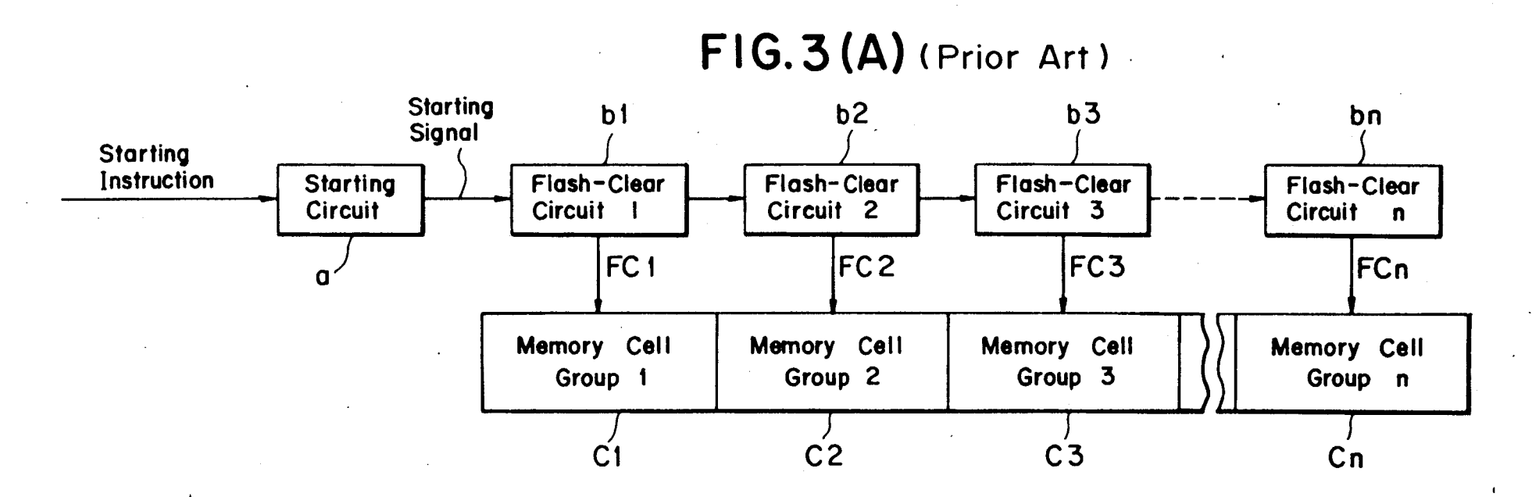
FIG. 3(A) is a circuit block diagram illustrating the general construction of another conventional memory device having a flash-clear function.
Figure 3B:
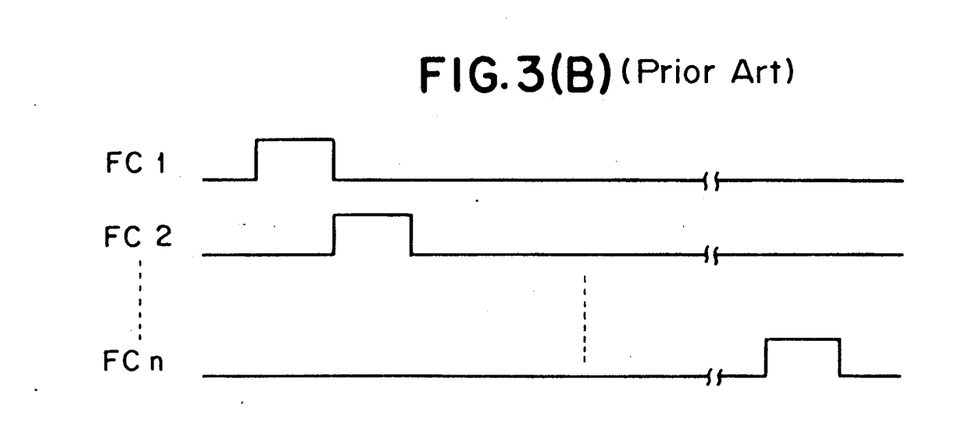
FIG. 3(B) is a time chart illustrating the operation of the memory device shown in FIG. 3(A)

The memory device is shown in a block diagram of FIG. 3(A). Referring to FIG. 3(A), the memory device shown includes a starting circuit a which generates a starting signal in response to a starting instruction signal fed thereto. The memory device further includes a plurality of flash clear circuits b1, b2, b3 . . . and bn which are provided in a corresponding relationship to a plurality of memory cell groups c1, c2, c3, . . . and cn which are formed by segmenting a memory cell array into n sections. The starting signal thus generated from the starting circuit a is supplied to the first flash-clear circuit b1, which thus sends a flash clearing signal FC1 to the first memory cell group c1 for flash-clearing of the same. Meanwhile, the flash-clear circuit b1 delays the starting signal received from the starting circuit a and forwards the thus delayed signal to the second flash-clear circuit b2. In response to the delayed starting signal from the first flash-clear circuit b1, the second flash-clear circuit b2 delivers a flash clearing signal FC2 to the memory cell group c2 for flash-clearing of the same. Meanwhile, the second flash-clear circuit b2 also delays the received starting signal and forwards the delayed signal to the third flash-clear circuit b3. Thus, the memory cells of the memory cell groups c1 to cn are successively flash-cleared in accordance with a predetermined order as seen from the time chart of FIG. 3(H). The memory device having such a construction as described above presents a significantly low value of peak current flow therein upon flash-clearing because the memory cell groups therein are flash-cleared at different timings.

In such a memory device as shown in FIG. 3(A), however, a separate flash-clear circuit b must be provided for each memory cell group c1 to cn. Accordingly, the memory device includes a significantly large number of flash-clear circuits b, which leads to a problem that the area of the chip of the memory device is significantly great.

SUMMARY OF THE INVENTION

It is an object of the present invention to provide a random access memory device which attains quick read-out of data stored in memory cells thereof.

It is another object of the present invention to provide a random access memory device which presents a significantly low value of peak current flow therein upon flash-clearing and is comparatively small in chip area.

According to one aspect of the present invention, there is provided a semiconductor memory device including transistors for precharging bit lines, wherein an access transistor among the transistors which constitute a memory cell is formed from a MOS transistor of a first conducting type while a variable load transistor connected to each of the bit lines is formed from another MOS transistor of a second conducting type.

According to another aspect of the present invention, there is provided a memory device with a flash-clearing function, wherein a memory cell array is segmented into a plurality of memory cell groups, and a flash-clearing circuit is provided commonly for the memory cell groups such that flash-clearing signals are delivered at different timings from the flash-clearing circuit to the individual memory cell groups.

BRIEF DESCRIPTION OF THE DRAWINGS

FIG. 18 comprising FIGS. 18(a)-18(c) is a waveform chart showing waveforms of signals in the memory device shown in FIG. 6 in which the pulse generator shown in FIG. 13 is employed.

DESCRIPTION OF THE PREFERRED EMBODIMENTS

A memory device according to a preferred embodiment of the present invention described below is in the form of an SRAM which is manufactured by the CMOS producing process. The memory device attains high speed operation by employing PMOS transistors as variable load means at the terminal ends of bit lines therein.

Figure 4:
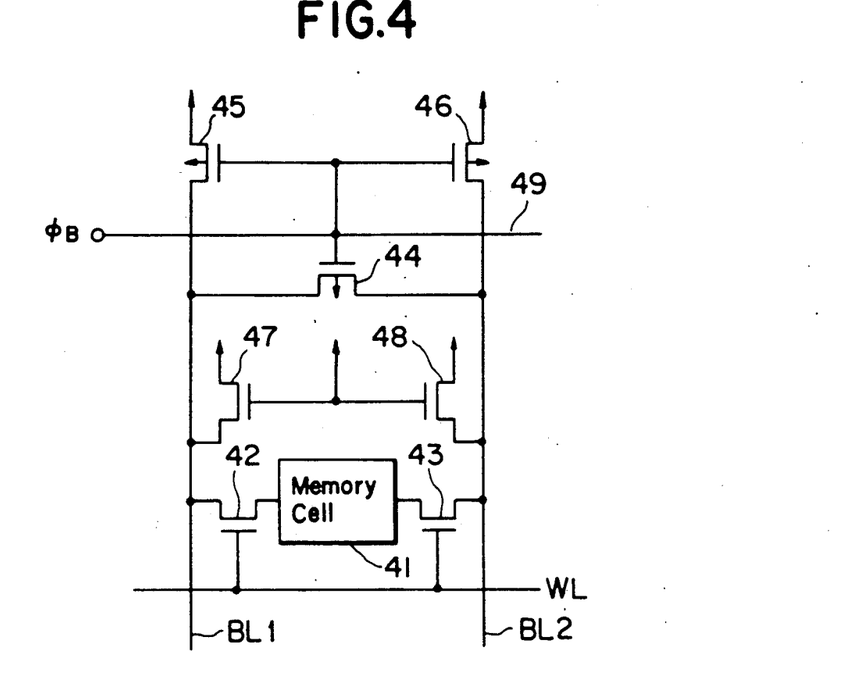
FIG. 4 is a circuit diagram similar to FIG. 1 but showing a memory device according to the present invention.

Referring first to FIG. 4, a detailed circuit construction of part of a memory device according to a preferred embodiment of the present invention is shown. The memory device shown includes a plurality of memory cells 41 (only one is shown) of a required construction. Each of the memory cells 41 is disposed between a pair of the bit lines BL1 and BL2 and connected via a pair of access transistors 42 and 43 to the bit lines BL1 and BL2, respectively. The access transistors 42 and 43 are each in the form of an NMOS transistor the gate of which is connected to a word line WL. The memory cells 41 are so arrayed as to form a matrix and accordingly, the memory device includes a plurality of pairs of bit lines.

A pair of PMOS transistors 45 and 46 serving as load elements are connected to terminal ends of each such bit line BL1 and BL2. A supply voltage Vcc is supplied to the sources of the PMOS transistors 45 and 46 while the drains of the PMOS transistors 45 and 46 are connected to the bit lines BL1 and BL2, respectively. The gates of the PMOS transistors 45 and 46 are connected to a precharge signal line 49 so as to receive a precharge signal Φb from the latter.

In the vicinity of each such PMOS transistor 45 and 46, there is disposed another PMOS transistor 44 for equalizing the bit lines BL1 and BL2. The source and drain of the PMOS transistor 44 are connected to the bit lines BL1 and BL2 while the gate of the PMOS transistor 44 is connected to the precharge signal line 49.

A pair of NMOS transistors 47 and 48 serving as first variable load means are provided for each of the memory cells 41 and connected to the bit lines BL1 and BL2, respectively. The gates and drains of the NMOS transistors 47 and 48 are connected in common so as to be supplied with the supply voltage Vcc while the sources thereof are connected to the bit lines BL1 and BL2, respectively.

Figure 5:
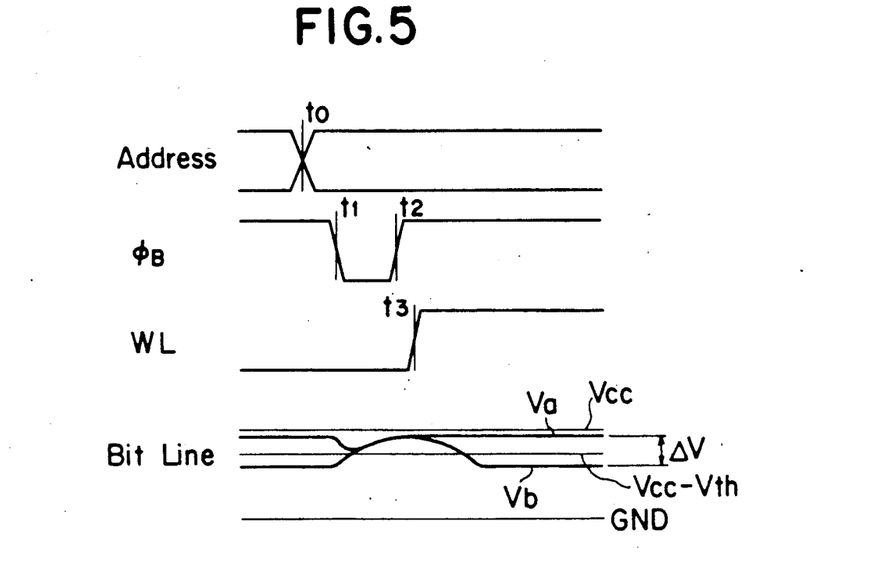
FIG. 5 is a signal waveform chart illustrating the operation of the memory device shown in FIG. 4.

Referring to FIG. 5, the operation of the memory device shown in FIG. 4 is illustrated in a waveform chart. At an initial stage, data of a preceding cycle still remain on the bit lines BL1 and BL2, and there exists a potential difference $\Delta V$ between the bit lines BL1 and BL2. Further, the precharge signal $\Phi B$ remains at a high level which is equal to the supply voltage Vcc, and the word line WL remains at a low level equal to the ground voltage GND. Accordingly, the PMOS transistors 44, 45 and 46 are all in an off-state; the access transistors 42 and 43 are also in an off-state; and one of the NMOS transistors 47 and 48 is in an on-state while the other is in an off-state.

Then at an instant t0, an address signal transits. In response to the address transition, the precharge signal $\Phi B$ falls from a high level to a low level at an instant t1. In response to such a fall of the precharge signal $\Phi b$ to a low level, all of the PMOS transistors 44, 45 and 46, the gates of which are connected to the precharge signal line 49, are turned on from the off-state. Consequently, the potentials of the bit lines BL1 and BL2 are equalized and then raised up to a voltage Va proximate to the supply voltage Vcc. During this equalizing and precharging operation, that one of the NMOS transistors 47 and 48 which has been in an on-state is turned off at the instant when the threshold voltage Vth is no further obtained. However, the access transistors 42 and 43 are not yet turned to an on-state.

Subsequently at an instant t2, the precharge voltage $\Phi b$ rises from a low level to a high level to turn the PMOS transistors 44, 45 and 46 off from the on-state. At that point of time, since both of the NMOS transistors 47 and 48 are already in the off-state, the bit lines BL1 and BL2 are placed into a floating state.

At an instant t3 after the bit lines BL1 and BL2 are brought into the floating state, the potential of the word line WL is raised from a low level to a high level. Due to such a potential change caused on the word line WL, the access transistors 42 and 43, the gates of which are connected to the word line WL, are turned on so that a pair of driving transistors (not shown) in the memory cell 41 are connected to the bit lines BL1 and BL2, respectively. As a result, the potential on one of the bit lines BL1 and BL2 is lowered by the corresponding driving transistor.

Then, at the instant when the potential thus lowered becomes lower than Vcc−Vth, a corresponding one of the NMOS transistors 47 and 48 is turned to an on-state. Consequently, a current path is established by the one of the NMOS transistors 47 and 48, the one of the access transistors 42 and 43 and the one driving transistor of the memory cell 41. The potential Vb on the bit line BL1 and BL2, which potential has been lowered by the corresponding driving transistor, is thereafter maintained at a level conforming to the resistance division of the bit lines BL1 and BL2.

With the memory device described above, precharging enables read-out of data in a floating state of the bit lines BL1 and BL2 and realization of high speed read-out of data. Since the potential difference $\Delta V$ which appears particularly during the reading operation is a potential difference between the voltages Vb and Va proximate to the supply voltage Vcc, it exhibits, compared with the voltage difference in a conventional memory device, a value which is greater by an amount corresponding to the difference between the supply voltage Vcc and the voltage Va which is proximate to the supply voltage Vcc. Consequently, it is rendered possible to diminish the burden to a sense amplifier and so forth as well as to increase the gain of the sense amplifier to eventually attain fast operation.

With regard to the process of manufacture, the memory device described above is advantageous in that it eliminates the necessity of the provision of special NMOS transistors which have a lower threshold voltage Vth(L) than an ordinary threshold voltage Vth, and the circuit construction can be accomplished by directly applying the CMOS producing process. Accordingly, the problem with regard to an increase of production steps is also resolved.

It is to be noted that the memory cells of the memory device may be either of the high-resistance load type or the complete CMOS type.

Figure 6:
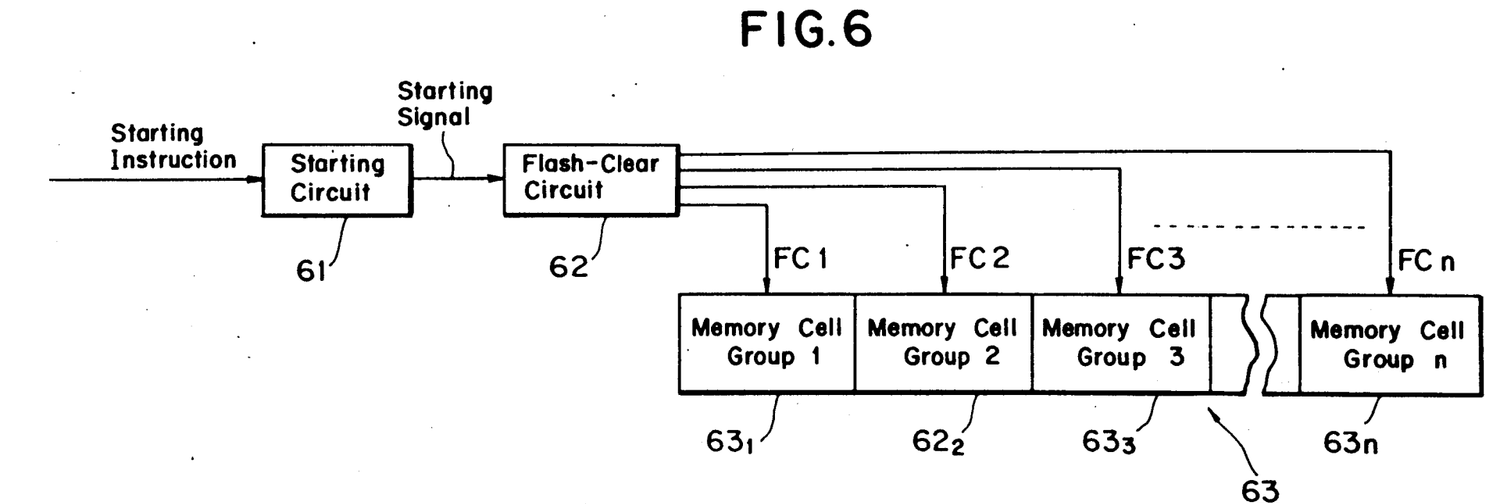
FIG. 6 is a block diagram illustrating the basic construction of the memory device shown in FIG. 4 where the memory device has a flash-clearing function.
Figure 7:
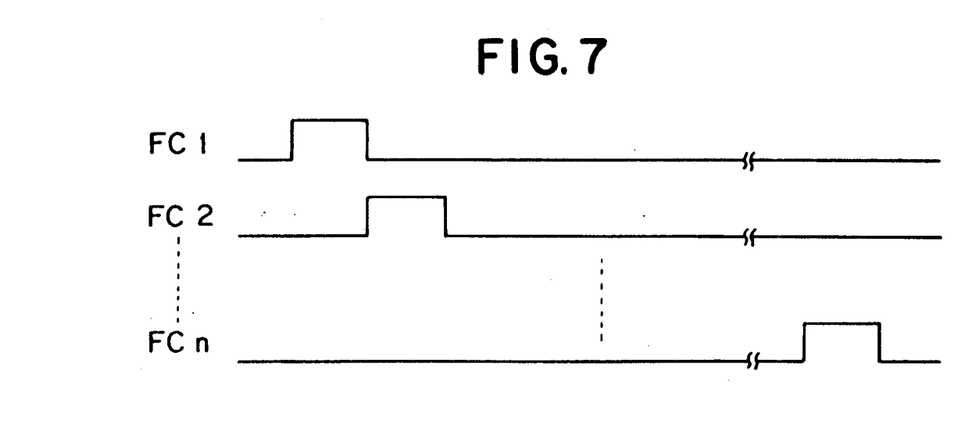
FIG. 7 is a time chart illustrating the flash-clearing light signals in the memory device shown in FIG. 6.

Referring now to FIG. 6, there is shown the basic construction of a memory device according to the present invention which has an improved flash-clearing function. The memory device shown includes a starting circuit 61 and a flash-clear circuit 62 which delivers flash clear signals FC1 to FCn to a plurality of memory cell groups $63_1$ to $63_n$ of a memory cell array 63 of the memory device, respectively. The flash clear signals FC1 to FCn may have a binary value "1" as seen in FIG. 7 and are delivered at successively delayed timings to the memory cell array 63 for flash-clearing operation.

Due to such successive time lags with which the flash-clear signals FC1 to FCn are delivered to the individual memory cell groups $63_1$ to $63_n$, current flow in the memory device exhibits a significantly small peak value and only one such flash-clear circuit 62 is required. Consequently, the size of the chip of the memory device is significantly small.

Figure 8:
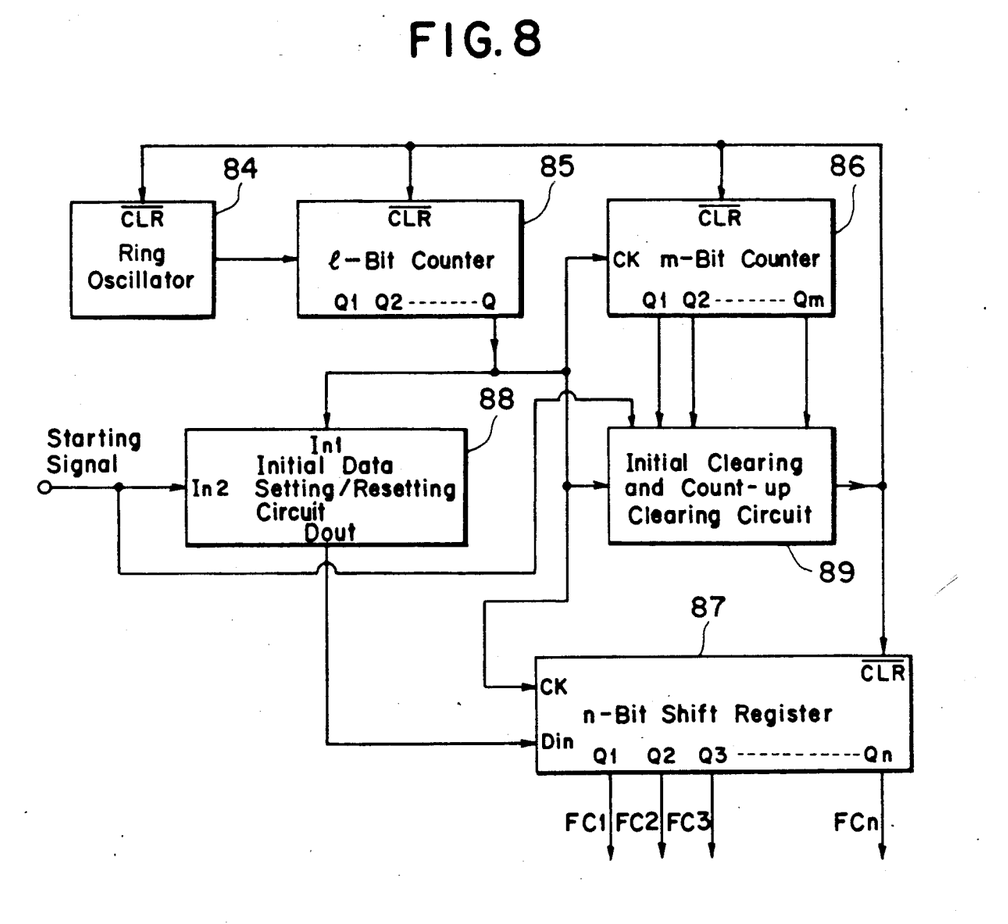
FIG. 8 is a circuit block diagram showing a flash-clearing circuit of the memory device shown in FIG. 6.

Referring now to FIG. 8, detailed construction of the flash-clear circuit 82 is shown. The flash-clear circuit 82 shown includes a ring oscillator 84 with an oscillation halt function for generating clock pulses CLK which are to be used for the setting of a clear time. The flash-clear circuit 82 further includes an l-bit counter 85 for counting the number of output clock pulses CLK of the ring oscillator 84 to set a clear time, an m-bit counter 86 for counting the number of memory cell groups which constitute the memory cell array 63, an n-bit shift register 87 for successively supplying flash clear signals FC1 to FCn to the memory cell groups $63_1$ to $63_n$ with predetermined timing lags, an initial data setting/resetting circuit 88 for supplying initial data to the n-bit shift register 87, and an initial clearing and count-up clearing circuit 89 for clearing the counters 85 and 86, ring oscillator 84 and n-bit shift register 87.

Figure 9:
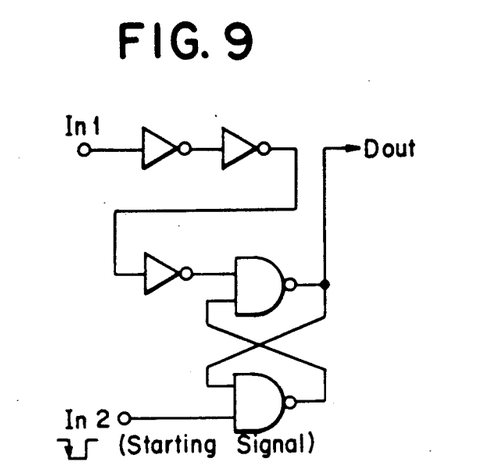
FIG. 9 is a circuit diagram showing an initial data setting/resetting circuit of the memory device shown in FIG. 6.

FIG. 9 shows the configuration of the initial data setting/resetting circuit 88 of the flash-clear circuit 62 described above. Referring to FIG. 9, the initial data setting/resetting circuit 88 shown includes a set/reset type flip-flop which is connected to receive at a first input terminal In1 thereof an lth bit output Ql of the l-bit counter 85 and to receive a starting signal at a second input terminal In2 thereof, and three inventors for delaying such lth output Ql of the l-bit counter 85 to be received by the flip-flop.

Figure 10:
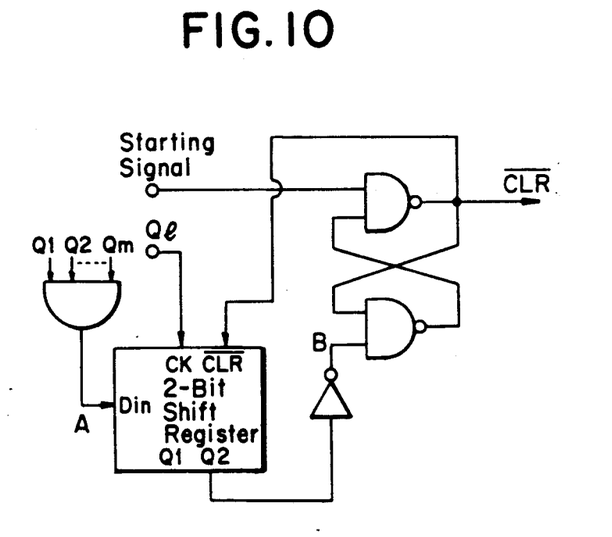
FIG. 10 is a circuit diagram showing an initial clearing and count-up clearing circuit of the memory device shown in FIG. 6.

Referring now FIG. 10, there is shown the configuration of the initial clearing and count-up clearing circuit 89 of the flash-clear circuit 62. The initial clearing and count-up clearing circuit 89 shown includes an AND circuit for obtaining a logical product of output bit signals Q1, Q2, . . . and Qm of the m-bit counter 86, a 2-bit shift register for receiving an output signal of the AND circuit, an invertor for inverting a second-bit output Q2 of the shift register, and a flip-flop for receiving an output signal of the invertor as a reset signal. The two-bit shift register receives an th-bit signal Ql of the l-bit counter as a clock pulse and also receives at its clear terminal a clear signal CLR which is an output of the flip-flop of the initial clear and count-up clear circuit 89.

Figure 11:
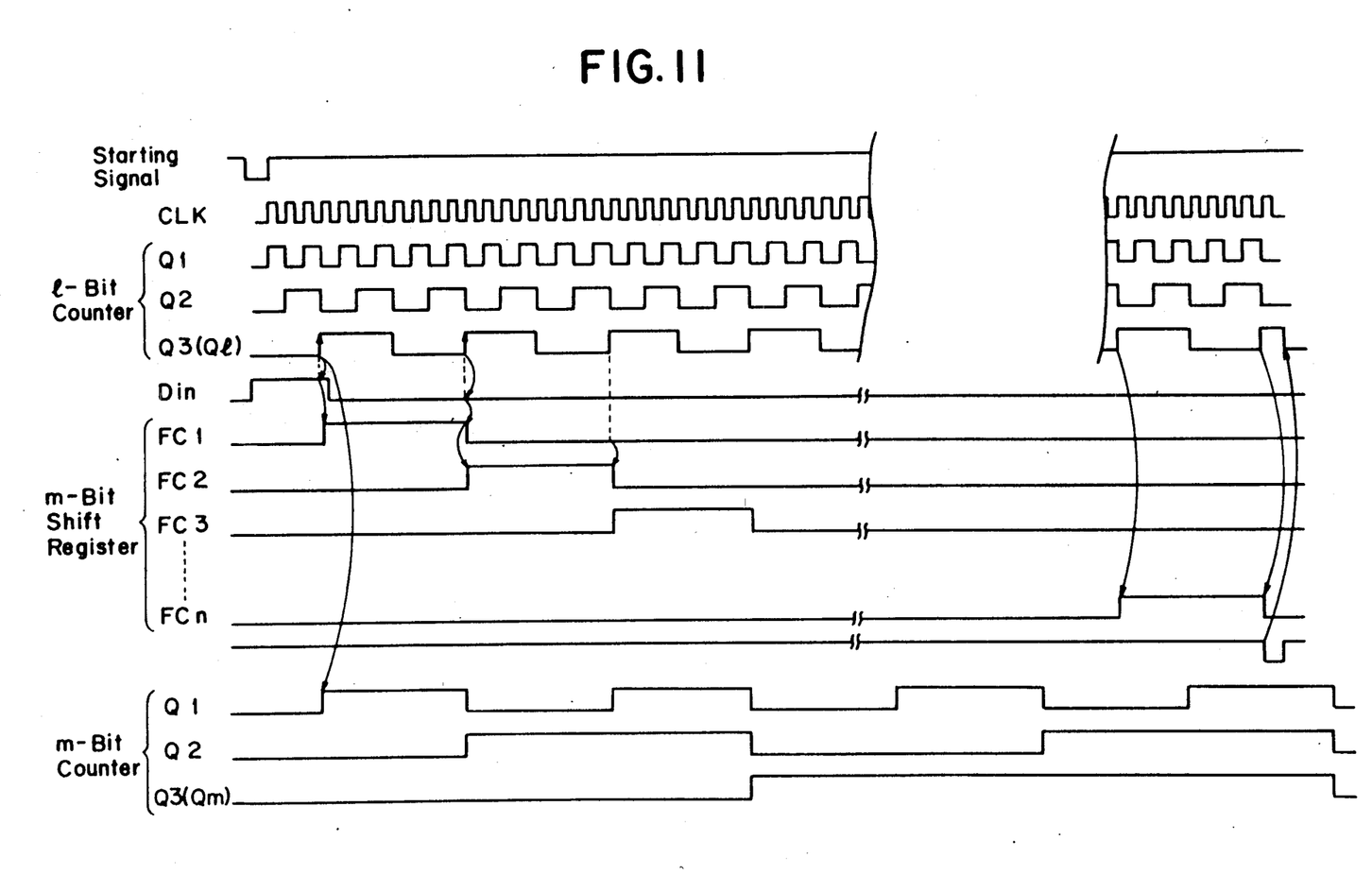
FIG. 11 is a time chart illustrating the operation of the flash-clearing circuit shown in FIG. 8.
Figure 12:
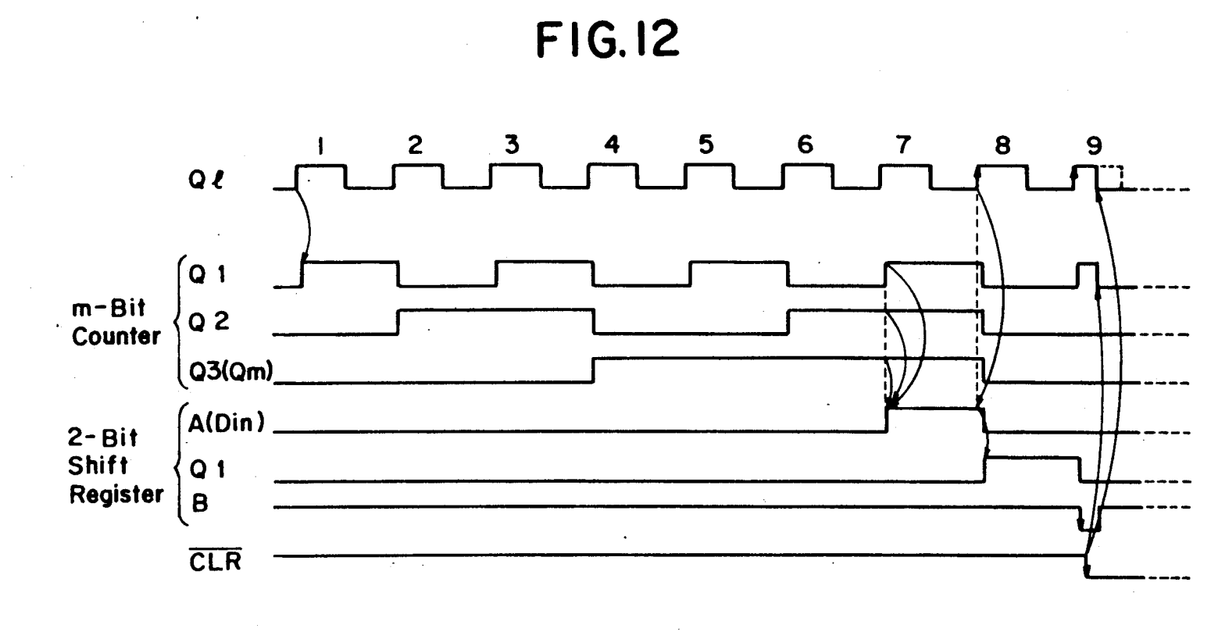
FIG. 12 is another time chart illustrating the operation of the initial clearing and count-up clearing circuit shown in FIG. 10.

FIGS. 11 and 12 illustrate the operation of the flash-clear circuit 62 shown in FIG. 8. Referring first to FIG. 11, when a starting signal is received from the starting circuit 61 shown in FIG. 6 or turned from a high level to a low level, all of the ring oscillator 84, l-bit counter 85, m-bit counter 86 and n-bit shift register 87 are initially cleared by an output CLR of the initial clearing and count-up clearing circuit 89. Then, when the starting signal subsequently rises from the low level to a high level, the ring oscillator 64 starts generating of clock pulses CLK, and the l-bit counter 85 counts the clock pulses CLK. When the final-or lth-bit output Ql of the l-bit counter 85 finally rises to a high level, the first-bit output Q1 of the m-bit counter 86 rises to a high level, and at the same time, the initial data setting/resetting circuit 88 is enabled to deliver an output Dout of a high level as an initial data Din to the n-bit shift register 87. Consequently, a first flash clear signal FC1 is forwarded from the n-bit shift register 87 to the first memory cell group 63$_1$. Immediately thereafter, the initial data Din falls to a low level and is thereafter maintained at the low level. In order to prevent the initial data Din from falling at a timing before clearing of the n-bit counter 87 is completed, the initial data setting/resetting circuit 88 includes therein a plurality of delaying invertors on the input In1 side of the flip-flop as shown in FIG. 9.

When the lth bit output Ql of the l-bit counter 85 subsequently rises again, the initial data in the n-bit shift register 87 is shifted. Consequently, a flash clear signal FC2 is delivered now from the second-bit output Q2 of the n-bit shift register 87. In this manner, flash clear signals FC1 to FCn are delivered successively from the n-bit shift register 87.

Then, when the flash clear signals FC1 to FCn have thus been delivered, all of the outputs Q1 to Qm (m=3 in the waveform chart shown in FIG. 12) of the m-bit counter 86 are turned to a high level as seen in FIG. 12 so that a signal A of a high level is introduced to the 2-bit shift register (FIG. 10) of the initial clearing and count-up clearing circuit 89. Then, in response to a rising edge of a subsequent next signal Ql (output signal of the l-bit counter), the signal A is outputted from the first-bit output Q1 of the 2-bit shift register. The output, however, is not used. Then, the signal A is shifted to the second bit of the 2-bit shift register in response to a rising edge of a next signal Ql. The output signal from the second bit of the 2-bit shift register is inverted by the invertor and introduced as a reset signal to the flip-flop in the initial clear and count-up clear circuit 87. As a result, the clear signal CLR is changed over from a high level to a low level to consequently halt operation of all of the ring oscillator 84, l-bit counter 85, m-bit counter 86 and n-bit shift register 87, thereby completing the series of flash-clearing operation.

With the flash-clear circuit employed in the memory device, setting of a clearing time can be made with a high degree of accuracy by selectively determining the oscillation frequency of the ring oscillator 84 and the count values of the two counters 85 and 86.

It is to be understood that a starting signal is based on the negative logic in the memory device described above but may otherwise be based on the positive logic. In the latter case, however, it is necessary to provide a logic invertor for each input terminal that receives such starting signal.

Figure 13:
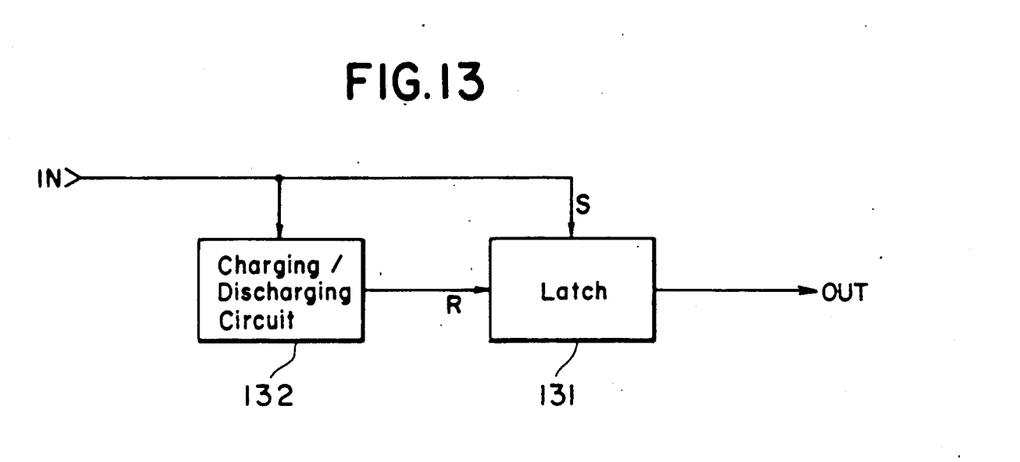
FIG. 13 is a block diagram illustrating the basic construction of a pulse generator for use with the memory device shown in FIG. 6.

The starting circuit 61 for producing a starting signal to start the flash-clear circuit 62 shown in FIG. 6 may be constituted, for example, from a pulse generator which has such a basic constitution as shown in FIG. 13.

Referring to FIG. 13, the pulse generator shown includes a latch circuit 131 and a charging/discharging circuit 132. An input pulse is received at an S (set) terminal of the latch circuit 131 and also by the charging/discharging circuit 132. Output of the charging/discharging circuit 132 is fed as a reset signal to an R (reset) terminal of the latch circuit 131. An output pulse of the entire pulse generator is delivered from the latch circuit 131.

In operation, at first the latch circuit 131 is set by an input pulse received to cause a rise (or otherwise a fall) of the output thereof. The input pulse is simultaneously fed also to the charging/discharging circuit 132 to cause the latter to make a charging operation or a discharging operation or else charging and discharging operations. Consequently, the output level of the charging/discharging circuit 132 varies in accordance with the operation thereof. When the output level crosses the threshold voltage at the R terminal of the latch circuit 131, the latch circuit 131 is reset to cause a fall (or a rise) of the output thereof.

With the pulse generator described above, the duration of the output pulse depends upon a charging or discharging characteristic of the charging/discharging circuit 132. Accordingly, an output pulse of a desired duration can be obtained from the pulse generator.

Figure 14:
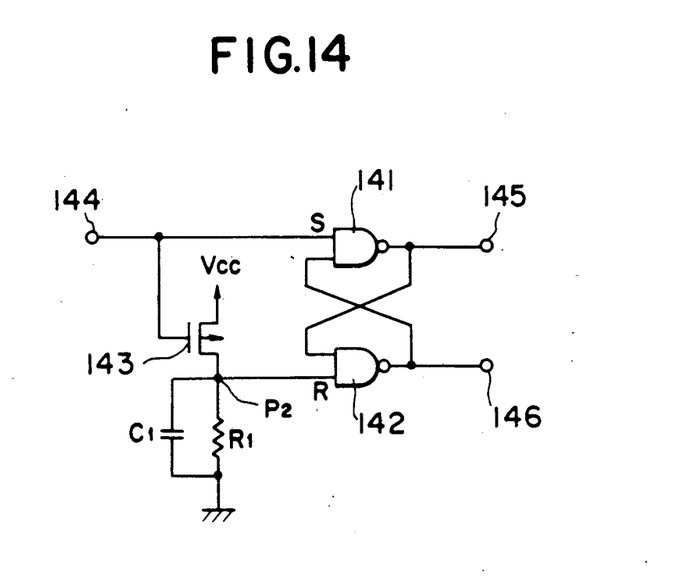
FIG. 14 is a circuit diagram showing a first exemplary circuit construction of the pulse generator shown in FIG. 13.

A more detailed circuit construction of the pulse generator is shown in FIG. 14. Referring to FIG. 14, the pulse generator shown includes a charging/discharging circuit composed of a resistor R1, a capacitor C1 and a PMOS transistor 143. The pulse generator further includes an SR latch circuit composed of a pair of 2-input NAND circuits 141 and 142 for receiving input pulses based on the negative logic.

The pulse generator has an input terminal 144 at which it receives a negative logic input pulse. The input terminal 144 is connected to the PMOS transistor 143 and also to the S terminal of the NAND circuit 141 of the latch circuit. The output terminal of the NAND circuit 141 is connected to a first output terminal 145 of the pulse generator and also to an input terminal of the other NAND circuit 142 of the latch circuit. The output terminal of the NAND circuit 142 is connected to a second output terminal 146 of the pulse generator and also to the other input terminal of the NAND circuit 141 of the latch circuit.

The gate of the PMOS transistor 143 of the charging-/discharging circuit is connected to the input terminal 144 of the pulse generator while the source is connected to a supply voltage Vcc. The drain of the PMOS transistor 143 is connected to one terminals of the resistor R1 and capacitor C1 and also to the R terminal of the NAND circuit 142. The resistor R1 and capacitor C1 are connected in parallel to each other, and a ground voltage GND is applied in common to the other terminals of the resistor R1 and capacitor C1.

Figure 15:
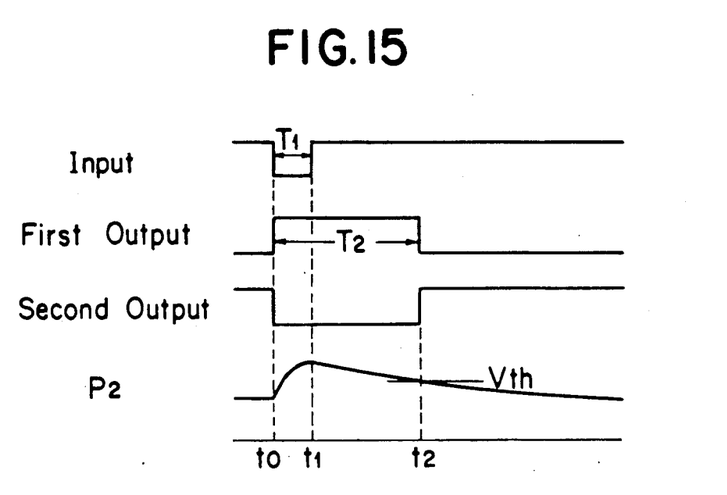
FIG. 15 is a waveform chart showing waveforms of signals in the circuit shown FIG. 14.

FIG. 15 illustrates the operation of the pulse generator shown in FIG. 14. Referring to FIG. 15, the voltage at a junction P2 among the PMOS transistor 143, resistor R1, capacitor C1 and NAND gate 142 shown in FIG. 14 initially exhibits a low level, and accordingly, the output of the NAND circuit 142 which makes a second output to be delivered from the second output terminal 146 remains at a high level. Thus, the two input terminals of the NAND circuit 141 are both at a high level so that a first output to be delivered from the first output terminal 145 presents a low level.

Then at an instant t0, a low-level input pulse is received at the input terminal 144. Thereupon, the output of the NAND circuit 141 is turned to a high level. The low-level input pulse is simultaneously fed also to the gate of the PMOS transistor 143 to turn the PMOS transistor 143 on. Consequently, the voltage at the junction P2 is gradually raised from the initial low level, while charging the capacitor, toward a high level substantially equal to the supply voltage Vcc. Then, at an instant when the voltage at the junction P2 crosses the input threshold voltage of the NAND circuit 142, the output of the NAND circuit 142 is turned from a high level to a low level.

Then at an instant t1 after lapse of a time T1 after the instant t0, the pulse is changed from the low level to a high level. However, no logic change is caused in the NAND circuit 141 by the level change of the input pulse at the input terminal 144 because the output of the NAND circuit 142 received at the other input terminal of the NAND circuit 141 is already at a low level. To the contrary, the PMOS transistor 143 is switched from an on-state to an off-state in response to the level change of the input pulse. Consequently, the junction P2 is disconnected from the supply voltage Vcc so that discharging is started by the capacitor C1 and resistor R1.

When discharging by the capacitor C1 and resistor R1 proceeds until the potential at the junction P2 crosses the threshold voltage Vth at the R terminal of the NAND circuit 142, that is, until the instant t2 at which a reset signal is supplied to the NAND circuit 142, the output of the NAND circuit is turned from a low level to a high level. Consequently, the output of the second output terminal 146 of the pulse generator is turned to a high level at that point of time. Since the output of the NAND circuit 142 is fed also to the NAND circuit 141, the two input terminals of the NAND circuit 141 are both turned to a high level so that the output of the NAND circuit 141 is turned to a low level.

With the pulse generator shown in FIG. 14, the time T2 from the instant t1 to the instant t2 is equal to the duration of an output pulse. Therefore, it is possible to establish a desired pulse duration which does not depend upon the duration T1 of the input pulse. For example, even if the input pulse duration T1 is 10 nsec or so, the output pulse duration T2 can be set to 1 second or so. The time T2 is determined by the discharging characteristic or time constant of the capacitor C1 and resistor R1 as described hereinabove. Therefore, the output pulse duration T2 can be adjusted as desired by properly selecting the values of the capacitor C1 and resistor R1 or the concentration of the impurities or the dielectric material and so forth.

In addition, both positive and negative pulses can be produced without provision of any additional gate circuit. Accordingly, the number of elements can be decreased significantly comparing with a conventional pulse generator which employs a row of invertors.

Figure 16:
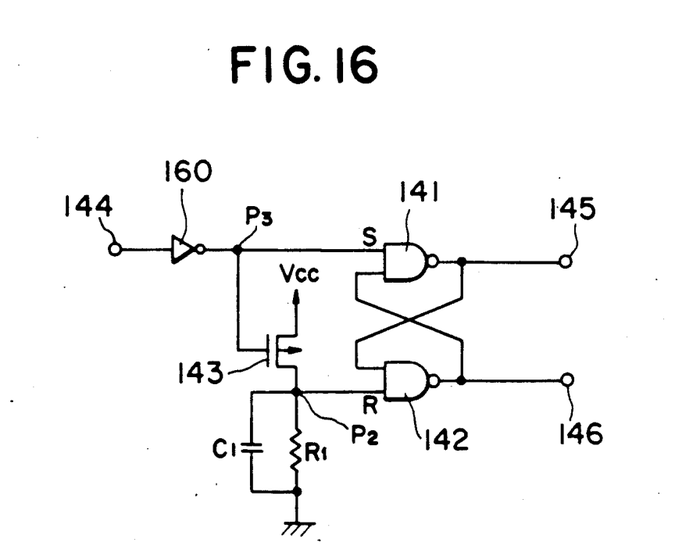
FIG. 16 is a circuit diagram showing a second exemplary circuit construction of the pulse generator shown in FIG. 13.

Another circuit configuration of the pulse generator is shown in FIG. 16. The pulse generator shown in FIG. 16 is a modification to the pulse generator shown in FIG. 14 so as to receive an input pulse based on positive logic.

Referring to FIG. 16, the pulse generator shown includes an RS latch circuit composed of a NAND circuit 141 and a NAND circuit 142, and a charging-/discharging circuit composed of a PMOS transistor 143, a capacitor C1 and a resistor R1, similarly to the pulse generator shown in FIG. 14. Since the RS latch circuit and charging/discharging circuit are similar to those of the pulse generator shown in FIG. 14, like reference symbols are used to denote like elements, and an overlapping description thereof is omitted herein.

The pulse generator shown in FIG. 16 is different from the pulse generator shown in FIG. 14 only in that an invertor 160 is connected to an input terminal 144, and the output of the invertor 160 is connected to a junction P3 between the gate of the PMOS transistor 143 and the S terminal of the NAND circuit 141.

Figure 17:
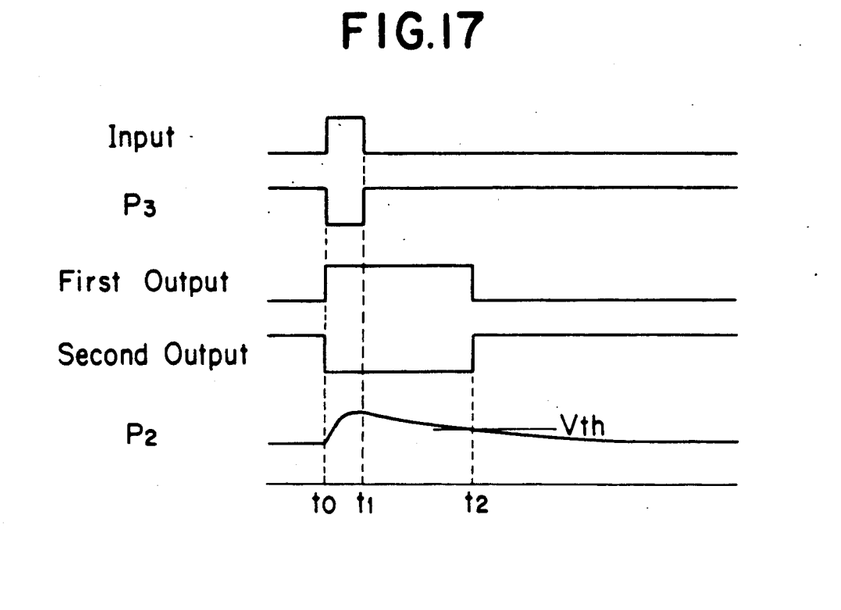
FIG. 17 is a waveform chart showing waveforms of signals in the circuit shown in FIG. 16.

In operation, when an input pulse based on the positive logic is received at the input terminal 144 of the pulse generator, it is inverted by the invertor 160 to make a signal of a low level at the junction P3 shown in FIG. 17. The signal level at the junction P3 corresponds to the level of the input pulse at the input terminal 144 in the pulse generator shown in FIG. 14. Thus, the pulse generator operates in response to an input pulse based on the positive logic in a quite similar manner as in the pulse generator shown in FIG. 14 which operates in response to an input pulse based on the negative logic.

Figure 18A:
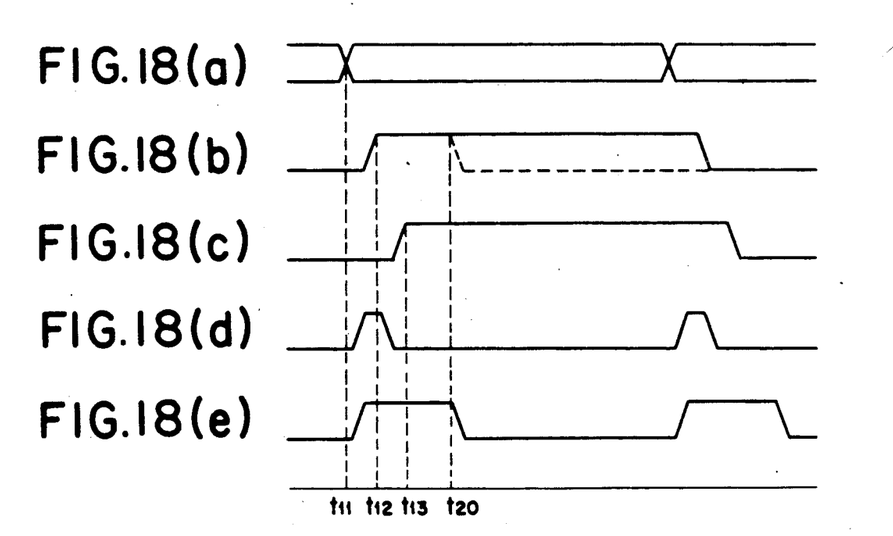

The pulse generators described above with reference to FIGS. 14 and 16 can be applied to some other circuits than a starting circuit for a flash-clear circuit. FIG. 18 illustrates the operation of a memory device in the form of an SRAM with an automatic power-down function in which a pulse generator is employed as a timing generator. In this instance, the pulse generator may have any circuit configuration including the circuit configurations shown in FIGS. 13, 14 and 16.

In FIG. 18, a waveform (a) indicates an address signal, (b) a word line potential, (c) a data output signal, (d) an output pulse signal of an ATD circuit (address transition detector), and (e) an automatic power-down signal.

Referring to FIG. 18, the address signal (a) transits at an instant t11, and then the word line potential (b) rises at another instant t12, and thereafter data is read out from the memory device at a subsequent instant t13. Of the word line potential waveform (b), a solid line portion indicates a waveform of the memory circuit where it does not have such an automatic power-down function. The solid line portion represents that the level thereof remains high for a considerably long period of time involving current flow in memory cells and a sense amplifier of the memory device, resulting in a disadvantage with regard to power consumption and so forth. In order to eliminate such disadvantage, the word line potential shown by the waveform (b) is sometimes caused to fall as indicated by a broken line after data has been settled. For this purpose, the duration of the output pulse (d) of the ATD circuit is elongated using the pulse generator described above to produce a timing t20 at which the word line potential (b) is to fall.

In particular, an output (d) of the ATD circuit is supplied to the pulse generator, whereupon the SR latch circuit operates to change the automatic power-down signal (e) from a low level to a high level. Then, when the output pulse (d) of the ATD circuit subsequently changes from the high level to a lower level, for example, the discharging operation of the charging/discharging circuit is started, and after a lapse of time determined by the time constant of the charging/discharging circuit, the automatic power-down signal (e) is changed from a high level to a low level at the instant t20. The automatic power-down signal (e) then is used as a trigger signal to cause a fall of the word line potential (b) as indicated by the broken line. Thereafter, in the same cycle, power consumption in the memory cells and the sense amplifier is diminished, and accordingly, power consumption of the entire memory device is reduced.

Particularly where any of the pulse generators shown in FIGS. 13, 14 and 16 is employed in an SRAM device, a resistor formed in the same process as a high-resistance element for the memory cells can be used as it is as the resistor (R1) of the charging/discharging circuit, which will eliminate the necessity of a great capacity.

Where any of the pulse generators shown in FIGS. 13, 14 and 16 is employed for a timer circuit of a microcomputer, pulses of various durations can be generated with respect to basic clock pulses and so forth. It is also possible to apply any of the pulse generators to a flash clear mechanism of a video RAM or the like or also as an initializing circuit for the setting of a time upon initialization.

While the charging/discharging circuit described above is so designed as to be reset principally by a discharge, it can be replaced by a charging/discharging circuit which is designed to be reset by a charge. Further, the RS latch circuit can be composed of a NOR circuit or circuits instead of NAND circuits.

With the pulse generators described above, the output pulse duration can be expanded independently of the pulse duration of an input pulse based on charging and discharging characteristics of the charging/discharging circuit, and the output pulse duration can be adjusted as desired in accordance with the selected values of the component resistor and capacitor which constituted the pulse generator. Furthermore, the entire circuit configuration can be simplified where any of the pulse generators is employed, and both positive and negative pulses can be produced simultaneously. In addition, any of the pulse generators can be applied to a variety of semiconductor IC devices.

What is claimed is:

1. A semiconductor memory device where in a plurality of memory cells are provided between a pair of bit lines, and are controlled via a word line and a precharging line, wherein the memory device comprises for each memory cell:

a pair of access transistors each formed from a MOS transistor of a first conductivity type channel, the memory cell being connected in series between the pair of access transistors between the pair of bit lines, each access transistor being connected to be selectively controlled by the word line;

a pair of MOS transistors of the first conductivity type channel each connected at the gate and drain thereof to an external voltage supply and at the source thereof to a separate one of the bit lines to act as first variable loads; and a pair of MOS transistors of a second conductivity type channel each connected at its source to the external voltage supply and at its drain to a separate one of the bit lines to individually terminate the bit line for performing a precharging operation before selection of the word line.

2. A semiconductor memory device according to claim 1, wherein a further MOS transistor of the second conductivity type channel is connected at its source and drain between the pair of bit lines and at its gate to the precharging line, to allow selective equalization of the voltages appearing on the bit lines.

3. A semiconductor memory device according to claim 2, wherein the gates of the pair of MOS transistors of the second conductivity type channel are also connected to the precharging line and perform a precharging operation before selection of the word line.

4. A semiconductor memory device according to claim 1, wherein the first conductivity type channel is an n-channel conductivity type.

* * * * *